(12) United States Patent
Tokashiki et al.

(10) Patent No.: US 10,766,057 B2
(45) Date of Patent: Sep. 8, 2020

(54) COMPONENTS AND SYSTEMS FOR CLEANING A TOOL FOR FORMING A SEMICONDUCTOR DEVICE, AND RELATED METHODS

(71) Applicant: Micron Technology, Inc., Boise, ID (US)

(72) Inventors: Ken Tokashiki, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 15/856,373

(22) Filed: Dec. 28, 2017

(65) Prior Publication Data
US 2019/0201945 A1      Jul. 4, 2019

(51) Int. Cl.
| | | |
|---|---|---|
| B08B 9/00 | (2006.01) |
| B08B 7/00 | (2006.01) |
| H01L 21/67 | (2006.01) |
| H01L 21/683 | (2006.01) |

(52) U.S. Cl.
CPC .............. *B08B 9/00* (2013.01); *B08B 7/0035* (2013.01); *B08B 7/0071* (2013.01); *H01L 21/67028* (2013.01); *H01L 21/67115* (2013.01); *H01L 21/6831* (2013.01); *H01L 21/6833* (2013.01)

(58) Field of Classification Search
CPC ........... B08B 9/00; B08B 7/0035; B08B 7/00; H01L 21/6833; H01L 21/6821; C23C 16/4405; C23C 14/564; C23C 16/4404; H01J 37/32862; H01J 2237/022; H01J 37/32642; Y10S 156/916; Y10S 438/905
USPC ....... 134/1.1, 1.2, 1, 166 R, 22.1, 22.18, 30, 134/902, 95.1, 21, 35, 56 R; 428/209, 428/210, 212, 213, 215, 216, 220, 336, 428/337
See application file for complete search history.

(56) References Cited

U.S. PATENT DOCUMENTS

| | | | |
|---|---|---|---|
| 5,405,491 A | 4/1995 | Shahvandi et al. | |
| 5,486,235 A | 1/1996 | Ye et al. | |
| 5,671,119 A * | 9/1997 | Huang | B08B 1/00 361/234 |
| 5,705,080 A * | 1/1998 | Leung | C23C 16/4405 438/680 |
| 5,810,937 A * | 9/1998 | Gupta | B08B 7/0035 134/1.2 |
| 6,030,666 A | 2/2000 | Lam et al. | |
| 6,096,161 A | 8/2000 | Kim et al. | |

(Continued)

FOREIGN PATENT DOCUMENTS

| | | |
|---|---|---|
| WO | 9950473 A1 | 10/1999 |
| WO | 02093623 A2 | 11/2002 |
| WO | 2010030529 A2 | 3/2010 |

*Primary Examiner* — Nadine G Norton
*Assistant Examiner* — Christopher Remavege
(74) *Attorney, Agent, or Firm* — TraskBritt

(57) ABSTRACT

A method of cleaning a tool for forming a semiconductor device includes heating a wafer comprising a ceramic material to heat at least the ceramic material, positioning the heated wafer on an electrostatic chuck of a tool for forming a semiconductor device such that deposits located proximate the heated wafer are heated to vaporize at least some of the deposits, and removing the vaporized deposits from the tool. Related methods of forming semiconductor devices, related systems, and related cleaning wafers are disclosed.

27 Claims, 8 Drawing Sheets

(56) References Cited

U.S. PATENT DOCUMENTS

| | | | | |
|---|---|---|---|---|
| 6,159,333 | A * | 12/2000 | Gupta | C23C 16/4405 118/723 E |
| 6,328,041 | B1 * | 12/2001 | Brown | C23C 16/4405 134/1 |
| 6,475,336 | B1 | 11/2002 | Hubacek | |
| 6,479,410 | B2 * | 11/2002 | Shiota | C23C 16/401 257/E21.276 |
| 6,597,964 | B1 | 7/2003 | Huang et al. | |
| 6,786,222 | B2 * | 9/2004 | Frisa | B08B 7/00 134/1 |
| 7,060,622 | B2 * | 6/2006 | Miyamori | C23C 4/02 438/697 |
| 7,589,950 | B2 * | 9/2009 | Parkhe | H01L 21/6831 279/128 |
| 7,655,316 | B2 * | 2/2010 | Parkhe | B08B 1/00 428/192 |
| 8,057,633 | B2 | 11/2011 | Tsukamoto et al. | |
| 8,114,477 | B2 * | 2/2012 | Parkhe | B08B 1/00 134/6 |
| 8,211,238 | B2 | 7/2012 | Bailey, III et al. | |
| 8,454,027 | B2 | 6/2013 | Povolny et al. | |
| 8,647,442 | B2 * | 2/2014 | Yamazawa | B08B 1/00 134/19 |
| 9,595,456 | B2 * | 3/2017 | Humphrey | B24B 37/34 |
| 9,659,789 | B2 | 5/2017 | Takeda et al. | |
| 9,721,783 | B2 * | 8/2017 | Cheng | H01L 21/0209 |
| 2003/0183243 | A1 * | 10/2003 | Collins | B08B 7/00 134/1 |
| 2005/0161061 | A1 | 7/2005 | Shih et al. | |
| 2007/0163621 | A1 * | 7/2007 | Ishizaka | H01L 21/6708 134/22.1 |
| 2008/0066867 | A1 | 3/2008 | Kim et al. | |
| 2008/0152838 | A1 | 6/2008 | Sen et al. | |
| 2008/0289766 | A1 * | 11/2008 | Heemstra | H01J 37/32623 156/345.51 |
| 2009/0068433 | A1 * | 3/2009 | Rasheed | C04B 35/08 428/220 |
| 2009/0151870 | A1 * | 6/2009 | Urakawa | H01J 7/32623 156/345.1 |
| 2010/0044974 | A1 | 2/2010 | Kenworthy et al. | |
| 2014/0318575 | A1 * | 10/2014 | Parkhe | H01L 21/6831 134/1.1 |

* cited by examiner

COMPONENTS AND SYSTEMS FOR CLEANING A TOOL FOR FORMING A SEMICONDUCTOR DEVICE, AND RELATED METHODS

TECHNICAL FIELD

Embodiments disclosed herein relate to tools used during semiconductor device fabrication and systems for cleaning the tools, cleaning wafers for cleaning the tools, and to methods of cleaning a semiconductor tool using the cleaning wafer. More particularly, embodiments of the disclosure relate to semiconductor tools for forming semiconductor devices, systems for cleaning the tools, to a cleaning wafer comprising at least a high specific heat capacity material for heating a portion of the tool, and to methods of removing deposits from the tool using the cleaning wafer.

BACKGROUND

Fabrication of semiconductor devices includes performing various fabrication processes on a semiconductor substrate configured as a semiconductor wafer or other bulk semiconductor substrate. For example, different electrically insulative materials and electrically conductive materials may be formed over a semiconductor substrate. The electrically insulative materials and the electrically conductive materials are patterned to form features of the semiconductor device, such as individual memory cells, transistors, capacitors, electrodes, conductive vias, or other features.

Patterning of the materials of the semiconductor device may include exposing one or more materials to a material removal process, such as an etching process. Etching processes may include, for example, a wet etching process or a dry etching process. Wet etching includes exposing the semiconductor device to a solution formulated to remove at least a portion of one or more materials of the semiconductor device. The semiconductor device may be exposed to the wet etchant by immersing the semiconductor device in the etchant, spraying the etchant onto the device, or another method.

Dry etching is another method of patterning a semiconductor device. Dry etching may include plasma etching, reactive ion etching (RIE), ion beam etching, or combinations thereof. Dry etching conventionally includes exposing the semiconductor device to a plasma formulated and configured to remove one or more materials of the semiconductor device therefrom. In a conventional dry etching process, reactive species in the plasma react with the material being removed to form a gaseous product, that may be carried out of the etch chamber under etching conditions (e.g., proper temperature, low pressure conditions, etc.). Depending on the materials being removed and the plasma used during the dry etching process, solid byproducts may be formed. In some instances, the byproducts include polymers, salts, or other materials that are not substantially removed from the etch chamber under the conditions of the dry etch process. The polymers, salts, or other materials may form deposits on walls and other surfaces of the etch chamber.

In some instances, the deposits may be electrically conductive, such as when the deposits comprise salts or a conductive polymer. In some such instances, electric charges may accumulate on the conductive deposits and may form an electric potential. If sufficient charge accumulates on the electrically conductive deposits, an arc may form between the deposits and the semiconductor substrate being processed. Such arcing may damage (e.g., break) the semiconductor substrate and may cause the semiconductor devices on the semiconductor substrate to fail.

Accordingly, after a certain number of wafers have been processed, the etch chamber may be cleaned to remove deposits therefrom. However, cleaning the etch tool may reduce the amount of time that the etch tool may be used for patterning semiconductor devices and may consequently undesirably reduce a throughput of the etch tool.

DETAILED DESCRIPTION

Figure 1A:
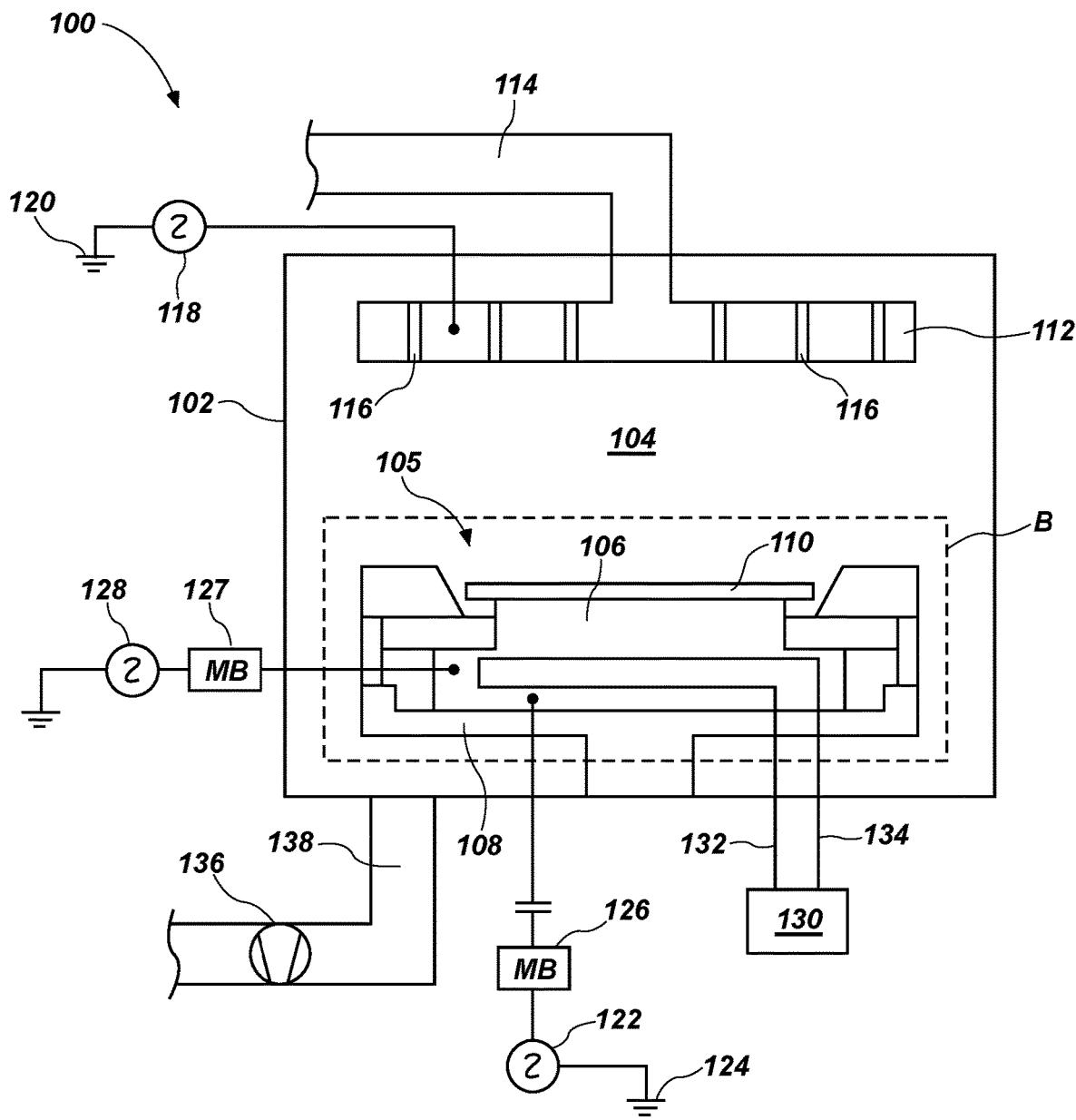
FIG. 1A is a simplified schematic of a tool for fabricating a semiconductor wafer, in accordance with embodiments of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a tool for fabricating semiconductor devices, a cleaning wafer, or a system for cleaning the tool, a complete description of a process flow for manufacturing such cleaning wafers, or a complete process flow for cleaning such tools. The structures described below do not form complete semiconductor structures or semiconductor devices. Only those process acts and structures necessary to understand the embodiments described herein are described in detail below. Additional acts to form a complete system for cleaning a tool, a semiconductor device, or a cleaning wafer described herein may be performed by conventional techniques.

According to embodiments disclosed herein, a system is configured for cleaning a tool (e.g., an etch tool, a deposition tool, etc.) used for forming a semiconductor device. The system includes a wafer, which may also be referred to herein as a "cleaning wafer" configured to transfer heat from a portion thereof to one or more regions (e.g., the pocket region, defined as a space between an electrostatic chuck of the tool and an edge ring thereof) of the tool. The cleaning wafer may include a first material comprising a material exhibiting a high specific heat capacity (referred to herein as a "high specific heat capacity" material or a "high specific heat" material. The cleaning wafer may, in some embodiments, further include a second material that may exhibit a relatively lower specific heat capacity than the first material. The first material may exhibit a relatively higher specific heat and, in some embodiments, a higher thermal conductivity compared to the second material. In some embodiments, the first material surrounds at least a portion of the second material. An outer diameter of the first material may be substantially the same as an outer diameter of semiconductor wafers that are processed in the tool. The first material may be located and positioned such that when the cleaning wafer is placed on the electrostatic chuck, heat is transferred from the first material to the pocket region of the tool to melt, vaporize, or otherwise heat materials (e.g., deposits, such as ammonium salts, polymers, etc.) in the pocket region and increase a vapor pressure thereof. The heated materials in the pocket region may be vaporized and removed from the tool, such as with a vacuum pump.

According to some embodiments, the cleaning wafer may be preheated in a heating chamber separate from the tool. The heating chamber may be configured to heat the cleaning wafer by, for example, a plasma, a heating lamp, microwave heating, or another method of heating. In some embodiments, a temperature of the first material may be higher than a temperature of the second material and the cleaning wafer may exhibit a non-uniform temperature profile responsive to being heated. After the cleaning wafer is preheated, the cleaning wafer may be transferred to the chamber (e.g., etch chamber) of the tool and placed on an electrostatic chuck thereof. In some embodiments, at least a portion of the first material may not be in direct contact with the electrostatic chuck and may at least partially overhang the electrostatic chuck. In some embodiments, the chamber of the tool may be exposed to a dry cleaning process after the cleaning wafer is disposed on the electrostatic chuck. The heat from the first material may heat deposits in the pocket region and increase a vapor pressure of the deposits, facilitating removal of such deposits. The heated deposits may be removed from the chamber, such as with a vacuum pump. The cleaning wafer may be configured to reduce a cleaning time of the tool and may facilitate substantial removal of deposits from the pocket region.

As used herein, the term "high specific heat capacity" material means and includes a material exhibiting a specific heat capacity greater than about 400 J/·K at a temperature of about 20° C.

Figure 1B:
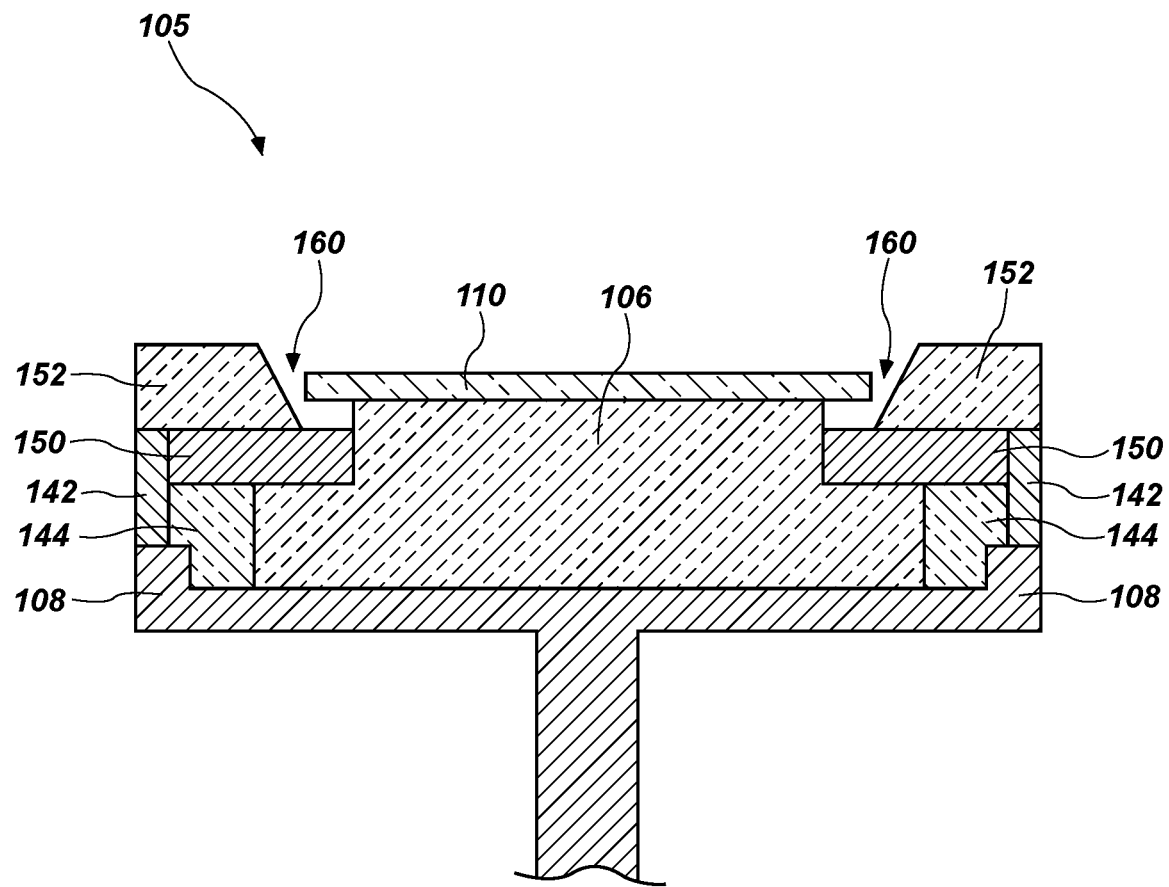
FIG. 1B is a simplified cross-sectional view of an assembly including a cleaning wafer disposed on an electrostatic chuck, in accordance with embodiments of the disclosure.

FIG. 1A is a simplified schematic of a tool 100, such as an etch tool. FIG. 1B is a simplified schematic illustrating portions of a substrate (e.g., wafer) holder assembly 105 shown in box B of FIG. 1A. The tool 100 may include a chamber 102 (e.g., an etch chamber) wherein plasma is generated for patterning features on a semiconductor wafer 110. During patterning of the semiconductor wafer 110, the semiconductor wafer 110 may be disposed on the substrate holder assembly 105 including an electrostatic chuck 106 disposed on a pedestal 108. The pedestal 108 may be configured to move up and down in the view illustrated in FIG. 1A to adjust a height of the semiconductor wafer 110 in the chamber 102. As will be described herein, although FIG. 1A and FIG. 1B have been described and illustrated as including semiconductor wafer 110 on the electrostatic chuck 106, the disclosure is not so limited. In other embodiments, the tool 100 may not include the electrostatic chuck 106 and the semiconductor wafer 110 may be disposed directly on the pedestal 108.

In some embodiments, the electrostatic chuck 106 may comprise a lower electrode of the tool 100. The tool 100 may also include an upper electrode 112. The upper electrode 112 may comprise, for example, a gas distribution showerhead configured for distributing one or more gases from a gas supply line 114. The gas distribution showerhead may include apertures 116 for distributing the gas from the gas supply line 114 into the chamber 102. Although FIG. 1A illustrates that the upper electrode 112 and the gas distribution showerhead are the same, it is contemplated that in other embodiments, the tool 100 may include a gas distribution showerhead that is separate from the upper electrode 112.

The upper electrode 112 may be electrically coupled to a power source 118 for providing power to the upper electrode 112 (e.g., to the gas distribution showerhead) for providing power to the gas supplied by the gas supply line 114 and generating a plasma in a region 104 between the upper electrode 112 and the semiconductor wafer 110. The power source 118 may comprise a high frequency radio frequency (RF) power source or a direct current (DC) power source. As known in the art, the power source 118 may be electrically coupled to, for example, an inductive coil, for generating the radio frequency power. Adjustment of the frequency of the high frequency power source 118 may alter an ion flux of the plasma generated by the upper electrode 112. The upper electrode 112 and the high frequency power source 118 may be electrically connected to an electrical ground 120. In some embodiments, the power source 118 may be configured to provide up to 4,000 W to the plasma. In some embodiments, the power source 118 comprises a DC power source.

Plasma generated from the gas supply 114 may be directed toward the semiconductor wafer 110. In some embodiments, the plasma may be generated with an excitation frequency of about 400 kHz. In some embodiments, the gases provided through the gas supply line 114 may include hydrogen ($H_2$), nitrogen ($N_2$), and a combination thereof (e.g., about 5 parts $H_2$ for every about 1 part $N_2$). The semiconductor wafer 110 may be biased through the electrostatic chuck 106. The electrostatic chuck 106 may be configured to hold the semiconductor wafer 110 in place by application of RF power. The electrostatic chuck 106 may be electrically coupled to a power source 122 for generating a low radio frequency power to bias the electrostatic chuck 106 and may be electrically connected to a ground 124. The power source 122 may be electrically connected to the electrostatic chuck 106 through a matching box 126. The matching box 126 may be configured to cause the load impedance of the power source 122 to match an internal (or output) impedance thereof when plasma is generated in the chamber 102. In some embodiments, application of a radio frequency power source through the power source 122 may bias the electrostatic chuck 106 relative to the plasma in the region 104 to adjust a bombardment energy of the plasma toward the semiconductor wafer 110. In some embodiments, the power source 122 may be configured to provide a power of up to about 4,000 W.

In some embodiments, the electrostatic chuck 106 may be electrically coupled to a power source 128, which may comprise a direct current power source or a high frequency radio frequency power source. In some embodiments, the power source 128 comprises a radio frequency power source and may be configured to provide low frequency RF power, high frequency RF power, or both to the electrostatic chuck 106. In some embodiments, the power source 128 is operably coupled to a matching box 127 configured to cause the load impedance of the power source 128 to match an internal (or output) impedance thereof when plasma is generated in the chamber 102. Application of power to the electrostatic chuck 106 through the power source 128 may bias the substrate 110 to the electrostatic chuck 106 by electrostatic (e.g., Coulomb's) forces. In some embodiments, the power source 128 may be configured to provide a power of up to about 4,000 W.

In some embodiments, the electrostatic chuck 106 may be connected to a cooling apparatus (e.g., a chiller) 130 configured to cool the electrostatic chuck 106 during use and operation. The cooling apparatus 130 may include a cooling supply line 132 that passes through the electrostatic chuck 106 and a return line 134 for returning a cooling medium to the cooling apparatus 130. The cooling medium may include ice water, a chilled brine solution, liquid carbon dioxide, liquid nitrogen, helium, or another material. The cooling apparatus 130 may be configured to maintain a temperature of the electrostatic chuck 106 below about room temperature (between about 20° C. and about 25° C.), below about 0° C., below about −50° C., below about −100° C., below about −150° C., or even below about −200° C. Although FIG. 1A is illustrated and described as including the cooling apparatus 130, the disclosure is not so limited. In other embodiments, the tool 100 may not include the cooling apparatus 130. In some embodiments, the tool 100 may be configured to provide so-called "back side" cooling to the semiconductor wafer 110, such as with helium gas.

In use and operation, an etching gas composition may be provided to the chamber 102 through the gas supply line 114 and the apertures 116 of the gas distribution showerhead. The plasma may be generated by applying a high frequency (e.g., a frequency between about 13 MHz and about 300 MHz, such as between about 13.56 MHz and about 40.68 MHz, or a frequency of about 60 MHz) to the upper electrode 112. The electrostatic chuck 106 may be biased with a relatively lower frequency (e.g., a frequency below between about 100 Hz and about 3.3 MHz) to create a potential difference between the plasma and the electrostatic chuck 106 to maintain a desired etch rate.

A vacuum pump 136 may be coupled to a gas discharge line 138 for removing excess plasma and at least some reaction byproducts from the chamber 102. The vacuum pump 136 may be configured to control a pressure of the chamber 102 during the plasma etching process.

FIG. 1B is an enlarged portion of box B of FIG. 1A illustrating the electrostatic chuck 106 and semiconductor wafer 110. The pedestal 108 may comprise a conductive member supporting the electrostatic chuck 106. The pedestal 108 may be electrically connected to an outer conductor ring 142, which may also be referred to as a ground ring. The outer conductor ring 142 may be disposed around an insulative ring 144, which may comprise a dielectric material and may electrically insulate the electrostatic chuck from the outer conductor ring 142.

An edge ring 150 may be located around an edge of the semiconductor wafer 110 and over a surface of the electrostatic chuck 106. The edge ring 150 may be positioned around an edge of a surface of the electrostatic chuck 106 and may be configured to confine the plasma in the chamber 102 to the area immediately proximate to and above the semiconductor wafer 110. The edge ring 150 may overlie a portion of the electrostatic chuck 106 and may be configured to protect the electrostatic chuck 106 from erosion or other damage that may otherwise be caused by the plasma. In some embodiments, the edge ring 150 may be configured to control a direction of the plasma in the chamber 102. The edge ring 150 may be secured to a periphery of the electrostatic chuck 106, such as by being placed around an inner portion of the electrostatic chuck 106.

The edge ring 150 may comprise aluminum oxide ($Al_2O_3$), silicon, silicon dioxide, silicon carbide, or another material. An insulative material 152 may overlie a portion of the edge ring 150. In some embodiments, the insulative material 152 comprises quartz.

Figure 1C:
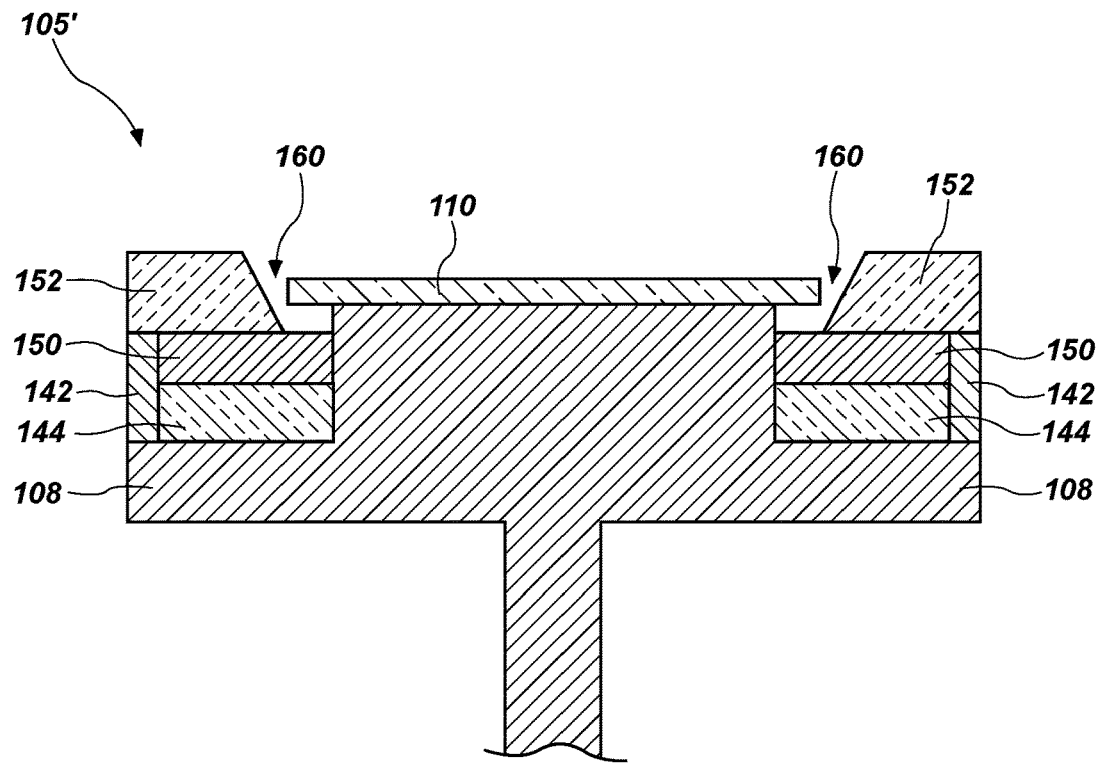
FIG. 1C and FIG. 1D are simplified cross-sectional views of an assembly including a cleaning wafer disposed on a pedestal, in accordance with embodiments of the disclosure.
Figure 1D:
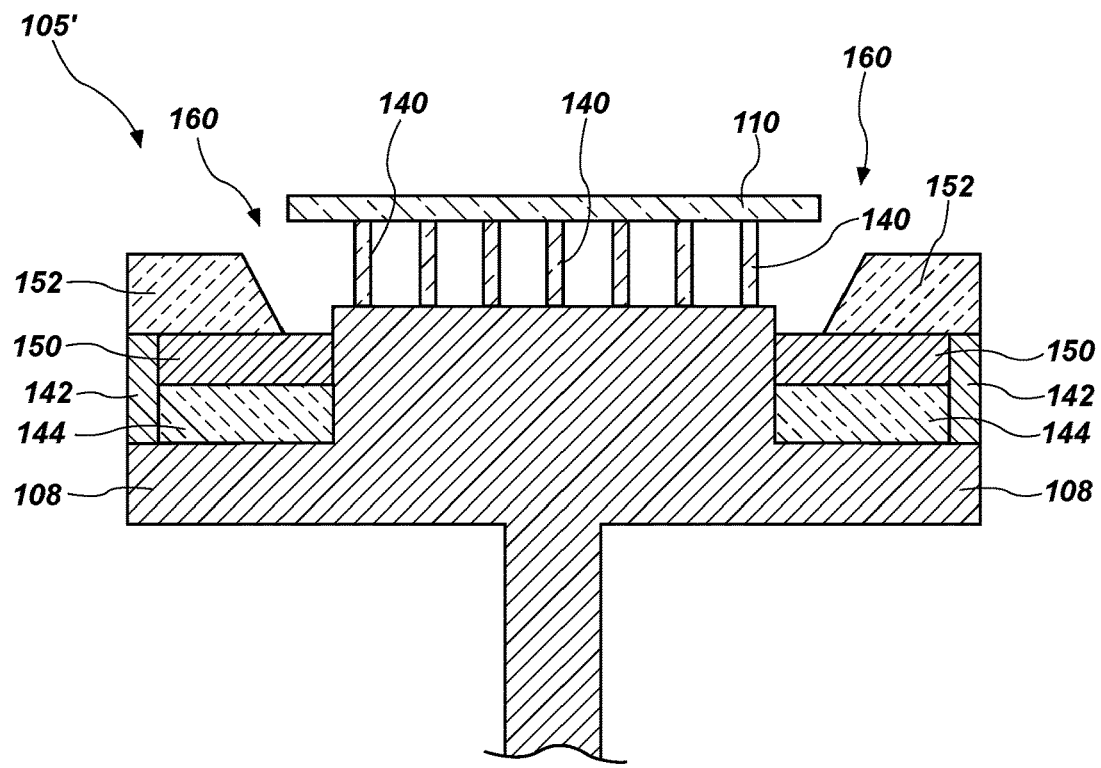

FIG. 1C is another embodiment of a substrate holder assembly 105'. The substrate holder assembly 105' may be substantially similar to the substrate holder assembly 105 described above with reference to FIG. 1B, but may not include the electrostatic chuck 106. In some such embodiments, the semiconductor wafer 110 may be mechanically attached to the pedestal 108. The semiconductor wafer 110 may directly overlie and contact the pedestal 108. Referring to FIG. 1D, the substrate holder assembly 105' may include lift pins 140 configured to separate the semiconductor wafer 110 from the pedestal 108.

In some instances, exposing the semiconductor wafer 110 to the plasma may generate reaction by-products exhibiting a low vapor pressure such that they are not substantially removed from the chamber 102. In some such embodiments, the reaction by-products may deposit on the chamber 102 walls, or in regions between the electrostatic chuck 106 and the semiconductor wafer 110 or other component of the tool 100. In addition, the reaction by-products may accumulate at a pocket region 160 defined at a location between the semiconductor wafer 110, the edge ring 150, and the insulative material 152.

Depending on the material on the semiconductor wafer 110 being patterned and the composition of the plasma, the reaction by-products may comprise polymers, salts, or other materials that may form deposits on portions of the tool 100. In some instances, the polymers may comprise a conductive material. The salts may comprise, for example, ammonium salts. By way of nonlimiting example, when the plasma comprises hydrogen bromide, ammonia, a fluorocarbon compound, or combinations thereof, ammonium salts may be undesirably formed in the tool 100 during processing of the semiconductor wafer 110. The ammonium salts (e.g., ammonium fluoride ($NH_4F$), ammonium chloride ($NH_4Cl$), and ammonium bromide ($NH_4Br$)) may deposit in the chamber 102 since they may not exhibit a sufficient vapor pressure under etching conditions to be removed through the gas discharge line 138 (FIG. 1A).

However, in some instances, electric charges may accumulate on the deposits during processing of the semiconductor wafer 110. Accordingly, after one or more semiconductor wafers 110 are processed in the tool 100, the tool 100 may be subjected to a so-called "dry cleaning" process to substantially remove any etch by-products from the chamber 102 (e.g., from the pocket 160 regions). As will be described herein, the tool 100 may be exposed to a dry cleaning process after one or more semiconductor wafers are patterned in the tool 100. In some embodiments, the dry cleaning process may include exposing the chamber 102 (e.g., walls of the chamber 102, the electrostatic chuck 106, the edge ring 150, and the insulative material 152) to a cleaning plasma. The cleaning plasma may include, for example, oxygen, argon, nitrogen, hydrogen, helium, chlorine, a fluorocarbon (e.g., carbon tetrafluoride ($CF_4$), octafluorocyclobutane ($C_4F_8$), etc.), sulfur hexafluoride ($SF_6$), another plasma, or combinations thereof.

Accordingly, after patterning the semiconductor wafer 110, the semiconductor wafer 110 may be removed from the electrostatic chuck 106 (or the pedestal 108) and the tool 100. A cleaning wafer may be introduced and disposed on the electrostatic chuck 106 (or the pedestal 108). The cleaning wafer may be configured to transfer heat to the pocket region 160 and facilitate removal of deposits in the pocket region 160 during the cleaning process.

Figure 2A:
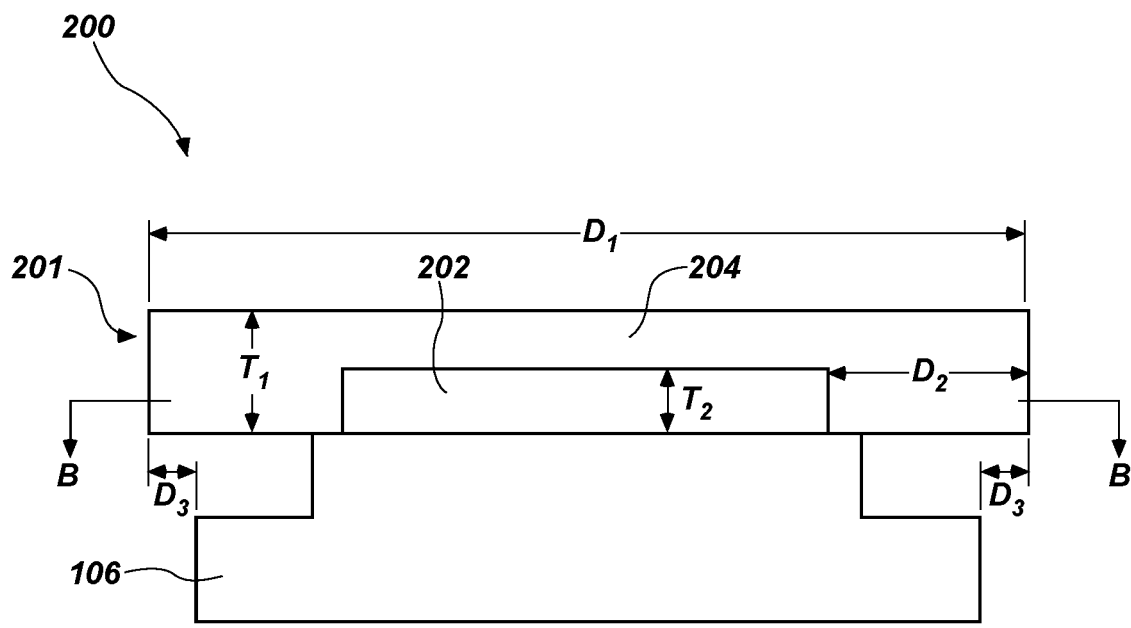
FIG. 2A and FIG. 2B are a respective side cross-sectional view and top cross-sectional view of a cleaning wafer assembly, in accordance with embodiments of the disclosure.
Figure 2B:
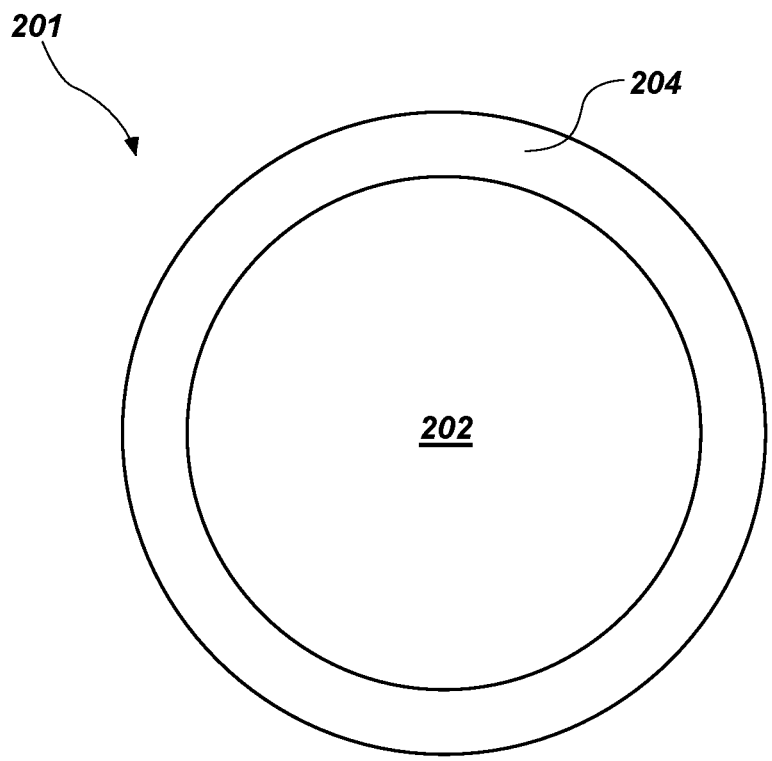

FIG. 2A is a simplified cross-sectional view of a cleaning wafer assembly 200 including a cleaning wafer 201 overlying the electrostatic chuck 106, in accordance with embodiments of the disclosure. FIG. 2B is a cross-sectional view of the cleaning wafer 201 taken through section line B-B of FIG. 2A. With reference to FIG. 2A and FIG. 2B, the cleaning wafer 201 may include a first material 204 surrounding a second material 202. In some embodiments, the first material 204 may be formulated and configured to exhibit a relatively high specific heat capacity relative to the second material 202. The second material 202 may overlie and contact a major surface of the electrostatic chuck 106.

The second material 202 may include a material exhibiting a specific heat capacity that is relatively lower than a specific heat capacity of the first material 204. In some embodiments, the By way of nonlimiting example, the second material 202 may include silicon, silicon dioxide, silicon nitride, a spin-on glass, borophosphosilicate glass (BPSG), phosphosilicate glass, borosilicate glass (BSG), silicon oxynitride, another material, and combinations thereof. In some embodiments, the second material 204 comprises a thermally insulative material (i.e., a material exhibiting a relatively low thermal conductivity).

The first material 204 may include a material formulated and configured to exhibit a specific heat capacity greater than a specific heat capacity of the second material 202. In some embodiments, the first material 204 exhibits a specific heat capacity greater than about 400 J/kg·K, greater than about 500 J/kg·K, greater than about 600 J/kg·K, greater than about 800 J/kg·K, greater than about 1,000 J/kg·K, or greater than about 1,200 J/·K at about 20° C.

The first material 204 may include a ceramic material, such as aluminum oxide, zirconium oxide ($ZrO_2$), aluminum nitride (AlN), boron nitride (BN), boron carbide (BN), silicon carbide (SiC), aluminum carbide, tungsten nitride (WN), beryllium oxide (BeO), polyimide, another high specific heat capacity material, and combinations thereof. In other embodiments, the first material 204 may include graphite, graphene, or another thermally conductive carbon-containing material. In some embodiments, the first material 204 comprises aluminum oxide.

The cleaning wafer 201 may be sized and shaped to have a diameter $D_1$ substantially equal to a diameter of a semiconductor wafer (e.g., the semiconductor wafer 110 (FIG. 1A)) processed in the chamber 102 (FIG. 1A). By way of nonlimiting example, the cleaning wafer 200 may have a diameter $D_1$ of about 100 mm, about 150 mm, about 200 mm, about 300 mm, or about 450 mm. In some embodiments, the diameter $D_1$ is about 300 mm. However, the disclosure is not so limited and the diameter $D_1$ may be larger or smaller than those described above.

A thickness $T_1$ of the first material 204 at radially outward portions of the cleaning wafer 200 may be between about 300 µm and about 1,000 µm, such as between about 300 µm and about 500 µm, between about 500 µm and about 750 µm, or between about 750 µm and about 1,000 µm. In some embodiments, the thickness $T_1$ is equal to about 760 µm, although the disclosure is not so limited to any such thickness.

The second material 202 may have a thickness $T_2$ less than the thickness $T_1$ of the first material 204. The thickness $T_2$ of the second material 202 may be between about 100 µm and about 700 µm, such as between about 100 µm and about 300 µm, between about 300 µm and about 500 µm, or between about 500 µm and about 700 µm. In some embodiments, the thickness $T_2$ may be about 400 µm. In some embodiments, the thickness $T_2$ of the second material 202 may be between about 10 percent and about 99 percent of the thickness $T_1$ of the first material 204, such as between about 10 percent and about 20 percent, between about 20 percent and about 30 percent, between about 30 percent and about 50 percent, between about 50 percent and about 75 percent, or between about 75 percent and about 95 percent of the thickness $T_1$ of the first material 204.

A distance $D_2$ between a radially outer surface of the second material 202 and a radially outer surface of the first material 204 may be between about 5 mm and about 20 mm, such as between about 5 mm and about 10 mm, between about 10 mm and about 15 mm, or between about 15 mm and about 20 mm. In some embodiments, the distance $D_2$ is equal to about 10 mm. Reducing the distance $D_2$ may reduce an amount of the first material 204 directly overlying and contacting the electrostatic chuck 106 which, in turn, may reduce an amount of heat transferred (e.g., lost) from the first material 204 to the electrostatic chuck 106. It is contemplated that in some embodiments, the second material 202 directly overlies and contacts the electrostatic chuck 106 while substantially no portion of the first material 204 directly contacts the electrostatic chuck 106. In some embodiments, an interface between the first material 204 and the second material 202 may be coplanar with an edge of the electrostatic chuck 106.

A distance $D_3$ that the first material 204 overhangs the electrostatic chuck 106 may be between about 1 mm and about 3 mm. For clarity, the distance $D_3$ in FIG. 2A is exaggerated. In some embodiments, the distance $D_3$ is equal to about 2 mm. However, the disclosure is not so limited and the distance $D_3$ may be different than those described above.

Figure 3A:
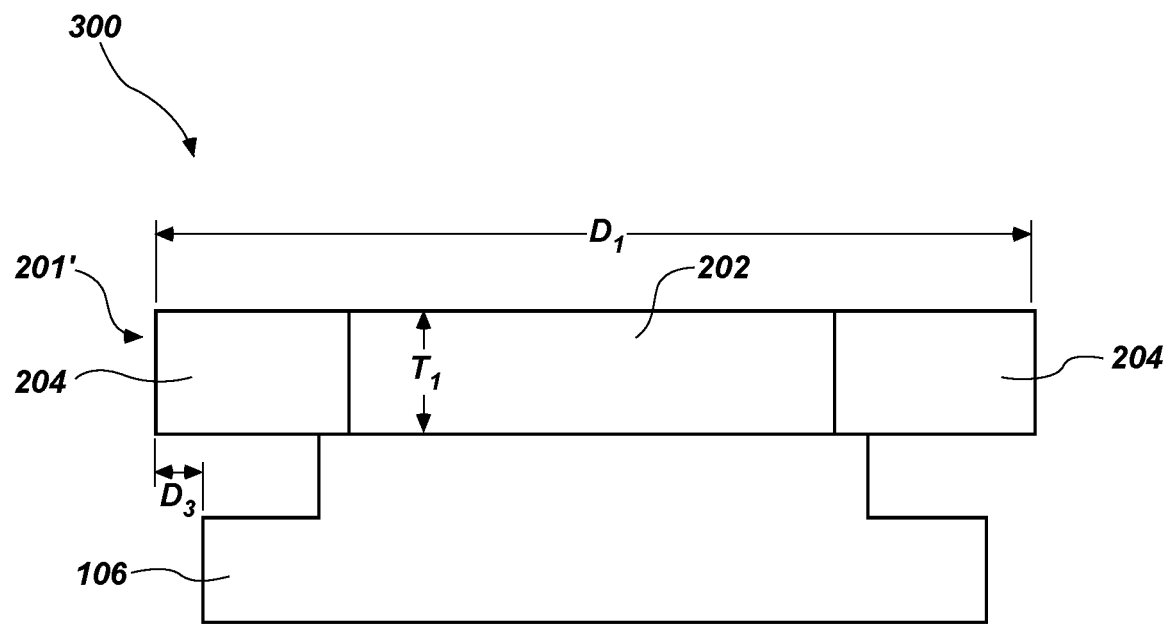
FIG. 3A and FIG. 3B are a respective side cross-sectional view and a top view of a heating wafer assembly, in accordance with other embodiments of the disclosure.
Figure 3B:
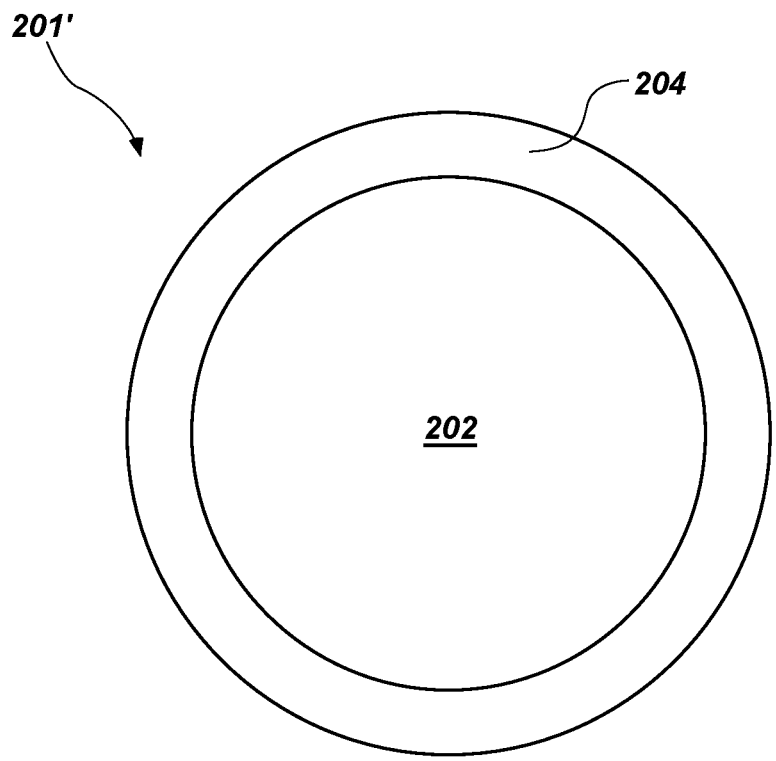

Referring to FIG. 3A and FIG. 3B, another embodiment of a cleaning wafer assembly 300 including a cleaning wafer 201' disposed on the electrostatic chuck 106 is described. FIG. 3A is a cross-sectional view of the cleaning wafer assembly 300 and FIG. 3B is a top view of the cleaning wafer 201'. The cleaning wafer 201' may include the first material 204 surrounding the second material 202.

The second material 202 may have the same thickness as the first material 204. In some such embodiments, the cleaning wafer 300 may comprise the second material 202 surrounded by a ring comprising the first material 204. Each of $D_1$, $D_3$, and $T_1$ may be the same as described above with reference to FIG. 2A and FIG. 2B.

Figure 4:
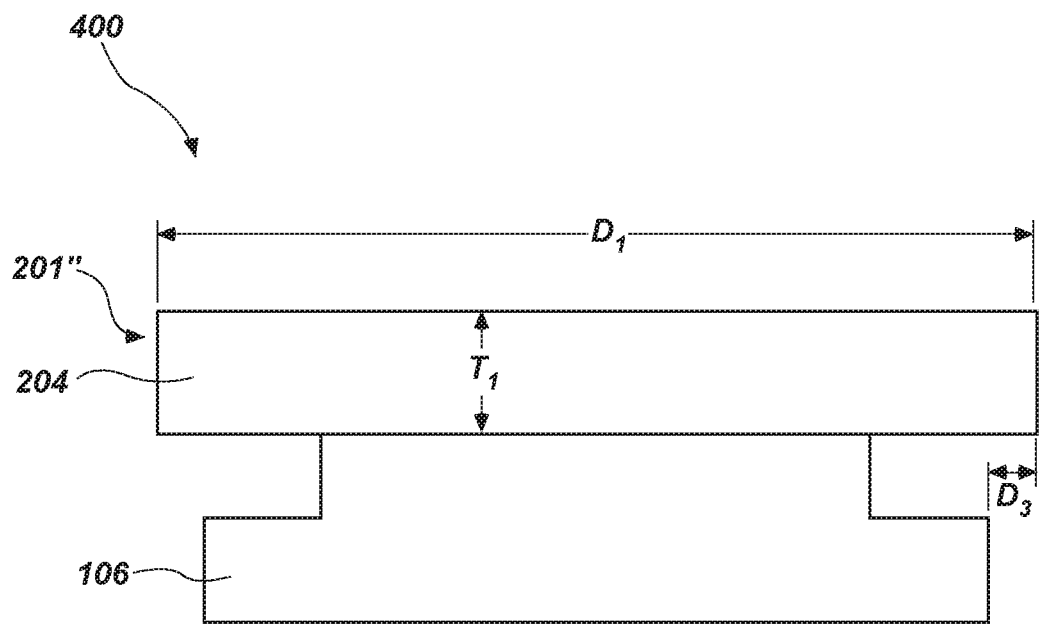
FIG. 4 is a cross-sectional view of another cleaning wafer assembly, in accordance with some embodiments of the disclosure.

FIG. 4 is a cross-sectional view of another embodiment of a cleaning wafer assembly 400 including a cleaning wafer 201" disposed on an electrostatic chuck 106. The cleaning wafer 201" may comprise or consist essentially of the first material 204 comprising the high specific heat capacity material. The first material 204 may directly overlie and contact the major surface of the electrostatic chuck 106.

Figure 5:
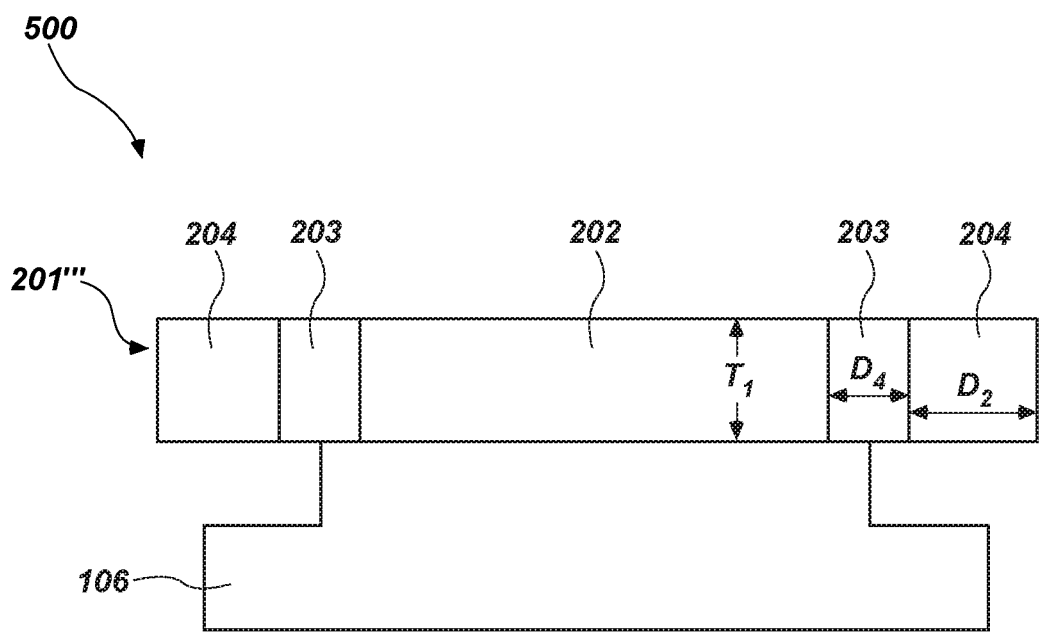
FIG. 5 is a cross-sectional view of a cleaning wafer assembly, in accordance with some embodiments of the disclosure.

FIG. 5 is a cross-sectional view of another embodiment of a cleaning wafer assembly 500 including a cleaning wafer 201''' disposed on an electrostatic chuck 106. The cleaning wafer 201''' includes the first material 204 comprising the high specific heat capacity material 204, such as aluminum oxide. The second material 202 may be disposed directly on and in contact with the electrostatic chuck. A third material 203 may be disposed between the second material 202 and the first material 204. The third material 203 may comprise, for example, silicon dioxide. In some embodiments, the second material 202 comprises silicon and the third material 203 comprise silicon dioxide.

A width $D_4$ of the third material 203 may be between about 3 mm and about 10 mm, such as between about 3 mm and about 5 mm, between about 5 mm and about 7 mm, or between about 7 mm and about 10 mm. In some embodiments, the width $D_4$ is about 5 mm.

In use and operation, the cleaning wafers 201, 201', 201", 201''' may be disposed on the electrostatic chuck 106 during dry cleaning operations to remove polymers, salts, or other deposits from the chamber 102 (FIG. 1A), such as from the pocket region 160 (FIG. 1B). In some embodiments, the cleaning wafers 201, 201', 201", 201''' are exposed to a heating environment to increase a temperature thereof and are subsequently disposed in the tool 100 on the electrostatic chuck 106. The cleaning wafers 201, 201', 201", 201''' may be disposed in the heating chamber prior to being introduced into the tool 100 and disposed on the electrostatic chuck 106.

Figure 6A:
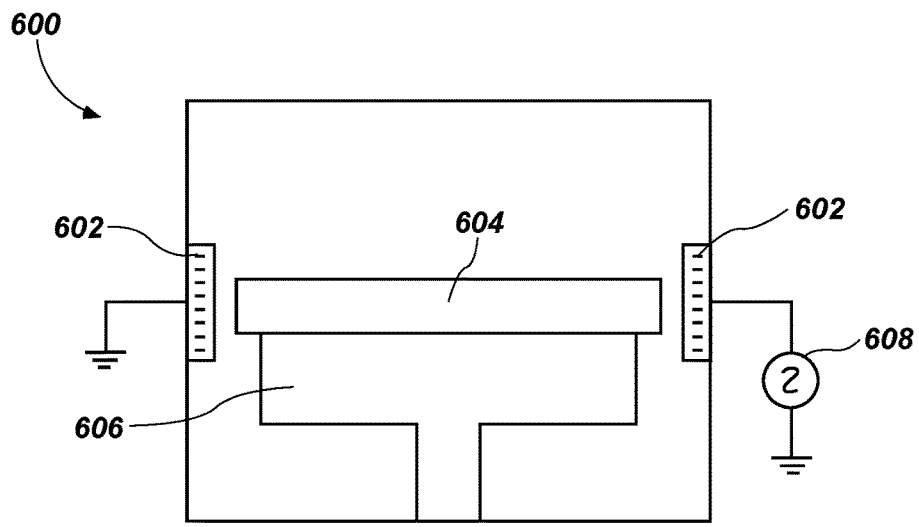
FIG. 6A through FIG. 6C are schematic views of heating assemblies, in accordance with embodiments of the disclosure.

FIG. 6A is a simplified schematic of a heating chamber 600 configured for heating a cleaning wafer 604, such as one of the cleaning wafers 201, 201', 201", 201''' described above. The cleaning wafer 604 may be supported on a pedestal 606 or another support. The heating chamber 600 may include a plasma heating system including coils 602 for generating a plasma. The coils 602 may be configured to heat the plasma within the heating chamber 600. A radio frequency (RF) power source 608 may be coupled to the coils 602. The radio-frequency power source 608 may be configured to provide a RF power to the coils 602 for generating the plasma.

In some embodiments, the coils 602 may be located proximate the edges of the cleaning wafer 604. In some embodiments, the coils 602 may be positioned around an inner diameter of the heating chamber 600 to substantially correspond to a shape of the cleaning wafer 604 and heat radially outer portions of the cleaning wafer 604 with the plasma. In some such embodiments, only the edge portions of the cleaning wafer 604 (e.g., the thermally conductive material) may be heated by the plasma. In other words, the thermally insulative material of the cleaning wafer 604, if any, may not be directly exposed to the heated plasma and the heated plasma may be directed substantially only to the thermally conductive material of the cleaning wafer 604.

Figure 6B:
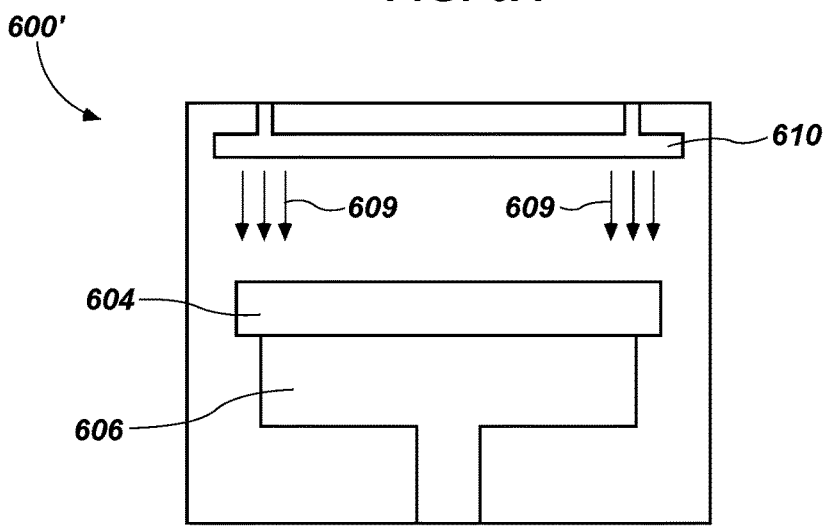
Figure 6C:
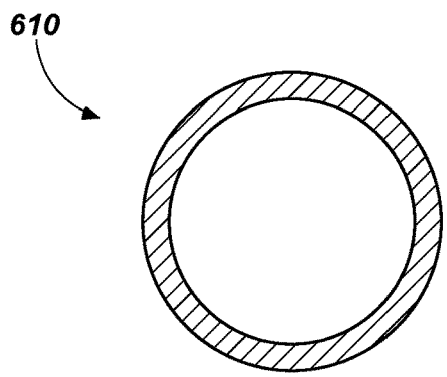

FIG. 6B is a simplified schematic of another embodiment of a heating chamber 600' configured for heating the cleaning wafers 201, 201', 201", 201'''. The heating chamber 600' may include the pedestal 606 configured to hold the cleaning wafer 604. The heating chamber 600' may include a heat source 610 configured to provide heat to cleaning wafer 604. In some embodiments, the heat source 610 may comprise a heating lamp. By way of nonlimiting example, the heat source 610 may comprise a circle-shaped (e.g., a donut-shaped) heat lamp configured for heating a periphery of the cleaning wafer 604 (e.g., the thermally conductive material). FIG. 6C is a top view of heat source 610, such as where the heat source 610 comprises a circle-shaped heat lamp. The heat source 610 may be configured to provide heat to a corresponding portion of the cleaning wafer 604. Accordingly, the heat source 610 may be configured to direct heat to outer portions of the cleaning wafer 604, indicated by arrows 609, while not directing substantial heat to inner portions of the cleaning wafer 604 (e.g., to the thermally insulative material).

Although FIG. 6A through FIG. 6C have described that the heating chamber 600, 600' include specific heating elements, the disclosure is not so limited. It is contemplated that in other embodiments, the cleaning wafer 604 may be heated by other methods, such as by microwave heating, resistive heating, and other heating methods for heating the cleaning wafer 604. In some embodiments, the heating chamber 600, 600' may be configured to heat the thermally conductive material while substantially not heating the thermally insulative material of the cleaning wafer 604.

Although the heating chamber 600, 600' has been described as being separate from the tool 100 (FIG. 1A), the disclosure is not so limited. In other embodiments, the tool 100 may include a component configured for providing heat directed toward at least the thermally conductive material of the cleaning wafer 604. By way of nonlimiting example, the tool 100 may include a heat lamp configured to provide heat to edge portions of a cleaning wafer 604 disposed on the electrostatic chuck 106 (FIG. 1A).

Accordingly, in some embodiments, a system for cleaning an tool for forming a semiconductor device comprises a wafer comprising a first material exhibiting a specific heat capacity greater than about 400 J/·K at about 20° C., a heating chamber configured to heat the wafer, and a tool comprising an electrostatic chuck configured to receive the wafer, an edge ring disposed around a portion of the electrostatic chuck, and a pocket region between the edge ring and the electrostatic chuck.

Accordingly, in some embodiments, a cleaning wafer for cleaning a tool used for fabricating a semiconductor device comprises a thermally insulative material, and a high specific heat capacity material exhibiting a specific heat capacity greater than about 400 J/·K at about 20° C. surrounding at least a portion of the thermally insulative material and configured to be disposed on an electrostatic chuck of a tool used for fabricating a semiconductor device, the high specific heat capacity material configured to overlie a pocket defined between the electrostatic chuck and an edge ring of the tool.

Figure 7:
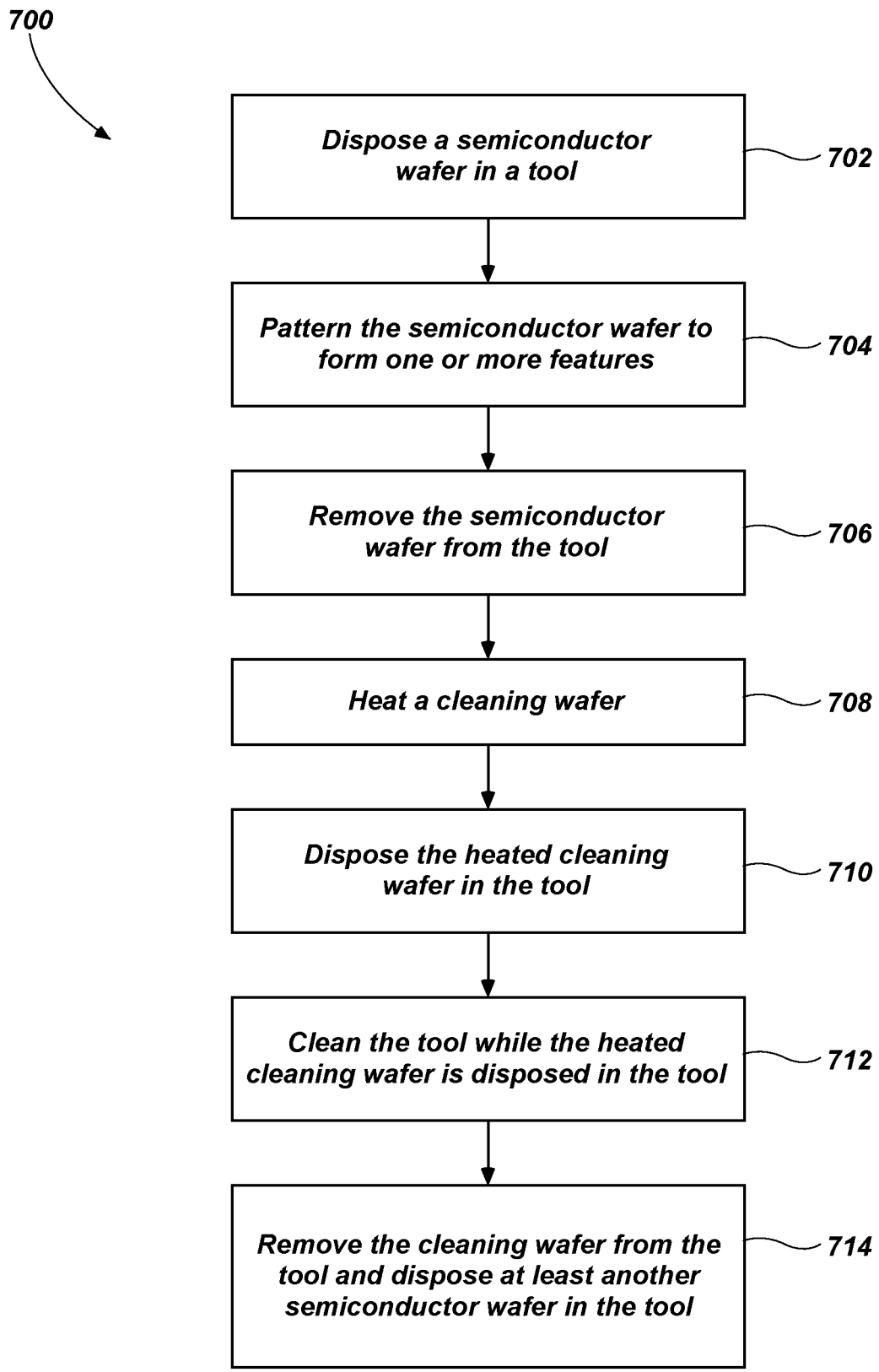
FIG. 7 is a simplified flow diagram of a method of fabricating a semiconductor device.

FIG. 7 is a simplified flow diagram illustrating a method 700 of fabricating a semiconductor device using the cleaning wafers described above. The method 700 may include act 702 including disposing a semiconductor wafer in a tool; act 704 including patterning the semiconductor wafer to form one or more features; act 706 including removing the semiconductor wafer from the tool; act 708 including heating a cleaning wafer; act 710 including disposing the cleaning wafer in the tool; act 712 including cleaning the tool while the cleaning wafer is disposed in the tool; act 714 including removing the cleaning wafer from the tool and disposing at least another semiconductor wafer in the tool.

Act 702 may include disposing a semiconductor wafer in a tool, such as in the tool 100 described above with reference to FIG. 1A. The semiconductor wafer may include any semiconductor wafer on which semiconductor structures and semiconductor devices are to be at least partially fabricated in the tool.

Act 704 includes patterning the semiconductor wafer to form one or more features of the semiconductor devices. Patterning the semiconductor wafer may include exposing the semiconductor wafer to one or more etch gases for forming structures (e.g., capacitors, conductive vias, transistors, electrodes, memory cells, etc.) in the semiconductor wafer to form one or more semiconductor devices. In some embodiments, patterning the semiconductor wafer may include forming patterns (e.g., structures) in one or more materials that may form byproducts, such as deposits (e.g., conductive polymers, salts, etc.), on surfaces of the tool. By way of nonlimiting example, patterning the semiconductor wafer with an etch gas comprising ammonia may form ammonium salts that deposit in the tool, such as in the pocket region 160 described above with reference to FIG. 1B through FIG. 1D. The deposits may, in some embodiments, be electrically conductive and cause arcing between the conductive deposits and the semiconductor wafer the tool during patterning processes.

Act 706 may include removing the patterned semiconductor wafer from the tool prior to cleaning the tool. Act 708 may include heating a cleaning wafer to a predetermined temperature. The cleaning wafer may include any of the cleaning wafers 201, 201', 201", 201''' described above with reference to FIG. 2A through FIG. 5. The cleaning wafer may be heated to a temperature based on the composition of the deposits in the tool. In some embodiments, the cleaning wafer may be heated to a temperature greater than about 100° C., greater than about 150° C., greater than about 200° C., greater than about 250° C., greater than about 300° C., greater than about 350° C., greater than about 400° C., greater than about 450° C., or greater than about 500° C.

The cleaning wafer may include a first material comprising a high specific heat capacity material, as described above with reference to FIG. 2A through FIG. 5. In some embodiments, heating the cleaning wafer may increase a temperature of the high specific heat capacity material at a relatively faster rate than other portions of the cleaning wafer. In some embodiments, the temperature of the first material may be increased without substantially increasing the temperature of other portions of the cleaning wafer.

In some embodiments, the cleaning wafer may be heated in a heating chamber separate from the tool, such as while the semiconductor wafer is being patterned as described in act 604. The heating chamber may comprise, for example, a heat lamp, a plasma chamber, a microwave chamber, or another chamber for heating the cleaning wafer, as described above with reference to FIG. 6A through FIG. 6C.

Act 710 may include disposing the heated cleaning wafer in the tool. In some embodiments, the cleaning wafer may be transported to the tool and disposed on the electrostatic chuck 106 (FIG. 1A). The cleaning wafer may be disposed on the electrostatic chuck 106 such that at least a portion of the first material of the cleaning wafer overlies the pocket region 160 (FIG. 1B). In some embodiments, the heated cleaning wafer may be transported from the heating chamber to the tool in, for example, a wafer cassette at a low pressure (e.g., a pressure below about 1.0 mmHg, such as from about 0.05 mmHg to about 1.0 mmHg). Maintaining a low pressure in the wafer cassette may reduce heat loss from the heated cleaning wafer while the cleaning wafer is transported to the tool.

Act 712 may include cleaning the tool while the heated, cleaning wafer is disposed in the tool. Cleaning the tool may include exposing the chamber to a dry gas or a plasma, such as, for example, oxygen, argon, nitrogen, hydrogen, helium, chlorine, a fluorocarbon (e.g., carbon tetrafluoride ($CF_4$), octafluorocyclobutane ($C_4F_8$), etc.), sulfur hexafluoride ($SF_6$), another plasma, or combinations thereof. In some embodiments, a pressure of the tool may be about 1.0 mmHg during cleaning thereof. In other embodiments, a pressure of the tool may be maintained below about 1.0 mmHg. A temperature of the tool may be between about room temperature (e.g., about 23° C.) and about 50° C., between about 50° C. and about 100° C., between about 100° C. and about 150° C., between about 150° C. and about 200° C., between about 200° C. and about 300° C., between about 300° C. and about 400° C., or between about 400° C. and about 500° C., although the disclosure is not so limited. In some embodiments, the temperature is between about 50° C. and about 100° C.

During the cleaning act, heat from the cleaning wafer (e.g., from the first material comprising the high specific heat material) may transfer from the heated cleaning wafer to portions of the chamber. For example, heat from the first material may transfer to the pocket region 160 (FIG. 1B), to the edge ring 150 (FIG. 1B), and to the insulative material 152 (FIG. 1B). In some embodiments, a temperature of the high specific heat capacity material may not substantially decrease during the cleaning act because of the high specific heat capacity of the material. Thus, the high specific heat capacity material may exhibit an elevated temperature during the cleaning act. Accordingly, the pocket region 160, the edge ring 150, and the insulative material 152 may be heated during the cleaning act. Deposits located in the pocket region 160, proximate the pocket region, the edge ring 150, and the insulative material 152 may be heated and a vapor pressure of deposits in such regions may be increased. The deposits in the pocket region 160, the edge ring 150, and the insulative material 152 may be heated to a temperature above the melting point or boiling point of the deposits, causing the deposits to volatilize or otherwise be removed from the pocket region 160, the edge ring 150, and the insulative material 152. Accordingly, any such deposits may be removed during the cleaning act.

In some embodiments, the electrostatic chuck 106 (FIG. 1A) may be cooled during the cleaning act. In some such embodiments, the second material of the cleaning wafer may remain at a desired temperature during the cleaning process. By way of nonlimiting example, the second material may be cooled by contact with the electrostatic chuck, while at least a portion of the first material is not in direct contact with the electrostatic chuck. In some embodiments, the electrostatic chuck may be cooled, such as with a chiller, backside gas cooling (e.g., with helium gas), or by other methods during the cleaning process.

Act 714 may include removing the cleaning wafer from the tool and disposing at least another semiconductor wafer in the tool after the cleaning process.

Although FIG. 7 illustrates that the tool is cleaned after every semiconductor wafer is patterned, the disclosure is not so limited. In some embodiments, act 702 through act 706 may be repeated a desired number of times until it is desirable or necessary to clean the tool. Empirical data may be employed to establish the number of times a tool may be utilized between cleanings.

Accordingly, in some embodiments, a method of cleaning a tool for forming a semiconductor device comprises heating a wafer comprising a ceramic material to heat at least the ceramic material, positioning the heated wafer on an electrostatic chuck of a tool for forming a semiconductor device such that deposits located proximate the heated wafer are heated to vaporize at least some of the deposits, and removing the vaporized deposits from the tool.

Accordingly, in at least some embodiments, a method of forming a semiconductor device comprises patterning a semiconductor wafer in a chamber of a tool, removing the semiconductor wafer from the tool, heating a cleaning wafer comprising a first material having a specific heat capacity greater than about 400 J/·K and a second material comprising a thermally insulative material, disposing the cleaning wafer on an electrostatic chuck of the tool, the first material proximate deposits located in a pocket region of the tool defined between the electrostatic chuck and an edge ring such that the deposits proximate the first material are heated, and removing the deposits from the tool.

Disposing the heated cleaning wafer in the tool during the cleaning process may facilitate cleaning of the tool more rapidly than conventional methods of cleaning the tool because only the cleaning wafer is heated rather than multiples components of the tool. In addition, since the high specific heat capacity material of the cleaning wafer is heated, heat may be transferred from the high specific heat capacity material to the pocket region to facilitate removal (e.g., vaporization) of any deposits proximate the high specific heat capacity material. The high specific heat capacity of the high specific heat capacity material may facilitate heating the pocket region without substantially reducing a temperature of the heating wafer (e.g., of the high specific heat capacity material). Since the high specific heat capacity material is shaped and configured to be disposed proximate the pocket region, deposits may be removed therefrom. By way of contrast, conventional cleaning methods may not sufficiently remove deposits in the pocket regions because at least some deposits may be located at locations between the edge ring, the electrostatic chuck, and a wafer that may be disposed in the chamber during the cleaning process and may not be sufficiently contacted by cleaning gases. In some embodiments, disposing the heated high specific heat capacity material proximate such regions may facilitate removal of any deposits in such regions.

In some embodiments, since the cleaning wafer may include a second material comprising, for example, a thermally insulative material, portions of the cleaning wafer in contact with the electrostatic chuck may not transfer heat to the electrostatic chuck. In some such embodiments, the electrostatic chuck may not be substantially heated by the cleaning wafer while the pocket region is heated. In some embodiments, the electrostatic chuck is cooled during the cleaning process while the pocket region is heated by the high specific heat capacity material. Since the electrostatic chuck is not heated, the cleaning process according to embodiments of the disclosure may be completed faster than conventional cleaning methods since heating and cooling cycles of the electrostatic chuck are eliminated. By way of example, conventional cleaning processes may require heating the entire tool to remove deposits, followed by cooling of the entire tool before subsequent semiconductor wafers are processed. As one example only, a conventional dry cleaning process may take about 90 minutes to sufficiently heat the chamber whereas the dry cleaning processes described herein including the heated cleaning wafer may take about 30 minutes or less. Accordingly, cleaning the tool according to the embodiments described herein may not require heating the entire chamber since the high specific heat capacity material may direct heat to the pocket regions where deposits may accumulate.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of cleaning a tool for forming a semiconductor device, the method comprising:
   heating a wafer comprising a first material comprising a ceramic material and a second material comprising a thermally insulative material having a different composition than the first material, the first material surrounding an outer circumference of the second material;
   positioning the heated wafer on an electrostatic chuck of a tool for forming a semiconductor device such that deposits located proximate the heated wafer are heated to vaporize at least some of the deposits, positioning the heated wafer on the electrostatic chuck comprising contacting a major surface of the electrostatic chuck with the second material and with the first material; and
   removing the vaporized deposits from the tool.

2. The method of claim 1, wherein heating a wafer comprising a second material comprises heating the wafer with a second material having a lower thermal conductivity than the first material, the second material comprising silicon, borophosphosilicate glass, phosphosilicate glass, or borosilicate glass.

3. The method of claim 1, wherein heating a wafer comprising a ceramic material comprises heating a wafer comprising a ceramic material including at least one of aluminum oxide, zirconium oxide, aluminum nitride, boron nitride, and boron carbide.

4. The method of claim 1, wherein heating a wafer comprising a ceramic material comprises heating a wafer comprising a ceramic material exhibiting a specific heat capacity greater than about 400 J/kgK at about 20° C.

5. The method of claim 1, wherein heating a wafer comprising a ceramic material comprises heating the wafer in a heating chamber prior to positioning the heated wafer on the electrostatic chuck of the tool.

6. The method of claim 1, further comprising cooling the second material below about 0° C. after placing the heated wafer on the electrostatic chuck.

7. The method of claim 1, wherein positioning the heated wafer on an electrostatic chuck of a tool for forming a semiconductor device such that deposits located proximate the heated wafer are heated to vaporize at least some of the deposits comprises heating one or more ammonium salts located proximate the heated wafer in a pocket region defined by a space between the heated wafer, an edge ring, and an insulative material proximate a periphery of the heated wafer.

8. The method of claim 1, wherein heating a wafer comprises heating the ceramic material to a temperature greater than about 300° C.

9. The method of claim 1, wherein positioning the heated wafer on an electrostatic chuck comprises transporting the heated wafer from a heating chamber to the tool at a pressure below about 1.0 mmHg.

10. The method of claim 1, further comprising exposing the tool to a plasma while the heated wafer is on the electrostatic chuck.

11. The method of claim 1, wherein positioning the heated wafer on an electrostatic chuck of a tool for forming a semiconductor device such that deposits located proximate the heated wafer are heated to vaporize at least some of the deposits comprises heating the deposits to at least about 300° C.

12. The method of claim 1, wherein heating a wafer comprises heating the wafer external to the tool.

13. A system for cleaning a tool for forming a semiconductor device, the system comprising:
   a wafer comprising a first material exhibiting a specific heat capacity greater than about 400 J/kgK at about 20° C. and a second material comprising a thermally insulative material, the first material surrounding an entire circumference of the second material and directly overlying and contacting an upper surface of the second material;
   a heating chamber configured to heat the wafer; and
   a tool comprising:
      an electrostatic chuck configured to receive the wafer;
      an edge ring disposed around a portion of the electrostatic chuck; and
      a pocket region between the edge ring and the electrostatic chuck, the wafer elevated relative to the edge ring, the pocket region at least partially defined by a space between the wafer and the edge ring, wherein a lower surface of the second material directly contacts the electrostatic chuck, the first material not contacting the electrostatic chuck.

14. The system of claim 13, wherein the second material comprises silicon dioxide or silicon nitride.

15. The system of claim 13, wherein the first material comprises at least one of aluminum oxide, zirconium oxide, aluminum nitride, boron nitride, and boron carbide.

16. The system of claim 13, wherein the first material is configured to overlie the pocket region.

17. The system of claim 13, wherein the heating chamber comprises a plasma chamber configured to heat the first material without substantially heating a thermally insulative material surrounded by the first material.

18. The system of claim 13, wherein the heating chamber comprises a heat lamp configured to heat the first material.

19. The system of claim 13, further comprising a chiller configured to cool the electrostatic chuck when the wafer is disposed on the electrostatic chuck.

20. A method of forming a semiconductor device, the method comprising:
   patterning a semiconductor wafer in a chamber of a tool;
   removing the semiconductor wafer from the tool;
   heating a cleaning wafer comprising a first material having a specific heat capacity greater than about 400 J/kg·K at about 20° C. and a second material comprising a thermally insulative material having a lower thermal conductivity than the first material, the first material surrounding only a circumference of the second material;
   disposing the heated cleaning wafer on an electrostatic chuck of the tool, the first material proximate deposits located in a pocket region of the tool defined between the electrostatic chuck and an edge ring such that the deposits proximate the first material are heated, disposing the heated cleaning wafer on the electrostatic chuck comprising contacting a central portion of the electrostatic chuck with the second material and an outer portion of the electrostatic chuck with the first material; and
   removing the deposits from the tool.

21. The method of claim 20, wherein removing the deposits from the tool comprises exposing the chamber to a cleaning plasma comprising at least one of oxygen, argon, nitrogen, hydrogen, helium, chlorine, a fluorocarbon, and sulfur hexafluoride.

22. The method of claim 20, wherein removing the deposits from the tool comprises heating the deposits while maintaining a pressure of the chamber below about 1.0 mmHg.

23. The method of claim 20, further comprising cooling the electrostatic chuck simultaneously with heating the deposits proximate the first material.

24. A cleaning wafer for cleaning a tool used for fabricating a semiconductor device, the cleaning wafer comprising:
   a thermally insulative material; and
   a high specific heat capacity material selected from the group consisting of boron nitride, boron carbide, aluminum carbide, tungsten nitride, beryllium oxide, polyimide, graphite, and graphene surrounding at least a portion of the thermally insulative material and configured to be disposed on an electrostatic chuck of a tool used for fabricating a semiconductor device, the high specific heat capacity material configured to overlie a pocket defined between the electrostatic chuck and an edge ring of the tool.

25. The cleaning wafer of claim 24, wherein the high specific heat capacity material comprises boron nitride, boron carbide, or a combination thereof.

26. The cleaning wafer of claim 24, wherein the high specific heat capacity material comprises a ring-shape disposed around a circumference of the thermally insulative material.

27. The cleaning wafer of claim 24, further comprising another material comprising silicon dioxide radially between the thermally insulative material and the high specific heat capacity material.

* * * * *

UNITED STATES PATENT AND TRADEMARK OFFICE
CERTIFICATE OF CORRECTION

PATENT NO. : 10,766,057 B2
APPLICATION NO. : 15/856373
DATED : September 8, 2020
INVENTOR(S) : Ken Tokashiki and Gurtej S. Sandhu Page 1 of 1

It is certified that error appears in the above-identified patent and that said Letters Patent is hereby corrected as shown below:

In the Specification

| | | |
|---|---|---|
| Column 3, | Line 61, | change "about 400 J/·K at" to --about 400 J/kg·K at-- |
| Column 7, | Line 51, | change "about 1,200 J/·K at" to --about 1,200 J/kg·K at-- |
| Column 10, | Line 33, | change "about 400 J/·K at" to --about 400 J/kg·K at-- |
| Column 10, | Line 43, | change "about 400 J/·K at" to --about 400 J/kg·K at-- |
| Column 13, | Line 6, | change "about 400 J/·K at" to --about 400 J/kg·K at-- |

In the Claims

| | | | |
|---|---|---|---|
| Claim 4, | Column 14, | Line 41, | change "about 400 J/kgK at" to --about 400 J/kg·K at-- |
| Claim 13, | Column 15, | Line 12, | change "about 400 J/kgK at" to --about 400 J/kg·K at-- |

Signed and Sealed this
Twelfth Day of January, 2021

Andrei Iancu
*Director of the United States Patent and Trademark Office*